United States Patent
Schreiber et al.

(10) Patent No.: US 7,107,199 B2
(45) Date of Patent: Sep. 12, 2006

(54) METHOD AND SYSTEM FOR THE DESIGN OF PIPELINES OF PROCESSORS

(75) Inventors: Robert S. Schreiber, Pal Alto, CA (US); Shail Aditya Gupta, Sunnyvale, CA (US); Vinod K. Kathail, Palo Alto, CA (US); Santosh George Abraham, Pleasanton, CA (US); Bantwal Ramakrishna Rau, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 670 days.

(21) Appl. No.: 10/284,932

(22) Filed: Oct. 31, 2002

(65) Prior Publication Data

US 2004/0088529 A1   May 6, 2004

(51) Int. Cl.
*G06F 17/50* (2006.01)
(52) U.S. Cl. ....................................... 703/13
(58) Field of Classification Search .............. 712/1, 712/23; 345/506; 708/406, 508; 382/203; 703/13
See application file for complete search history.

(56) References Cited

U.S. PATENT DOCUMENTS

| | | | |
|---|---|---|---|
| 5,455,938 A | 10/1995 | Ahmed | |
| 5,742,814 A | 4/1998 | Balasa et al. | |
| 5,764,951 A | 6/1998 | Ly et al. | |
| 6,064,819 A | 5/2000 | Franssen et al. | |
| 6,078,745 A | 6/2000 | De Greef et al. | |
| 6,298,071 B1 | 10/2001 | Taylor et al. | |
| 6,389,382 B1 | 5/2002 | Tanaka et al. | |
| 6,449,747 B1 | 9/2002 | Wuytack et al. | |
| 6,594,814 B1 * | 7/2003 | Jou et al. ....................... | 716/18 |
| 6,609,088 B1 | 8/2003 | Wuytack et al. | |
| 6,732,297 B1 * | 5/2004 | Oura ........................... | 714/33 |
| 6,772,415 B1 | 8/2004 | Danckaert et al. | |
| 6,839,889 B1 * | 1/2005 | Liu .............................. | 716/18 |
| 6,853,968 B1 * | 2/2005 | Burton ........................ | 703/17 |
| 6,934,250 B1 * | 8/2005 | Kejriwal et al. ............ | 370/229 |
| 2002/0032559 A1 | 3/2002 | Hellestrand et al. | |

FOREIGN PATENT DOCUMENTS

WO   WO01/59593   8/2001

OTHER PUBLICATIONS

Park, Sehwa: A software package foe synthesis of pipelines from behavioral specifications, IEE Transaction on computer aided design of integrated circuits, Mar. 1988, pp. 356-370.*
U.S. Appl. No. 10/223,224, Schreiber.
U.S. Appl. No. 10/284,844, Schreiber, et al.
U.S. Appl. No. 10/284,965, Gupta, et al.
Christine Eisenbeis, et al., "A Strategy for Array Management in Local Memory," (Jul. 1990) pp. 1-40.

(Continued)

*Primary Examiner*—Albert W. Paladini

(57) ABSTRACT

A method of designing a pipeline comprises the steps of: accepting a task procedure expressed in a standard programming language, the task procedure including a sequence of computational steps; accepting a performance requirement of the pipeline; and automatically creating a hardware description of the pipeline, the pipeline comprising a plurality of interconnected processor stages, each of the processor stages for performing a respective one of the computational steps, the pipeline having characteristics consistent with the performance requirement of the pipeline.

17 Claims, 4 Drawing Sheets

OTHER PUBLICATIONS

J. Rosseel, et al., "An Optimisation Methodology for Array Mapping of Affine Recurrence Equations in Video and Image Processing," IEEE, pp. 415-426 (1994).

S. Malik, "Analysis of Cyclic Combinational Circuits," Short Papers IEEE Transactions on Computer-aided Design of Integrated Circuits and Systems, vol. 13, No. 7, (Jul. 1994) pp. 950-956.

A. Srinivasan, et al. "Practical Analysis of Cyclic Combinational Circuits," IEEE 1996 Custom Integrated Circuits Conference, pp. 381-384.

Guest Editorial, IEEE Transactions on Computer-aided Design of Ingegrated Circuits and Systems, vol. 18, No. 1, (Jan. 1999) pp. 1-2.

K. Danckaert, et al. "Strategy for Power-Efficient Design of Parallel Systems," IEEE Transactions on Very Large Scale Integration (VLSI) Systems, vol. 7, No. 2, (Jun. 1999) pp. 258-265.

F. Vermeulen, et al., "Extended Design Reuse Trade-Offs in Hardware-Software Architecture Mapping," (2000) pp. 103-107.

R. Schreiber, et al., "High-Level Synthesis of Nonprogrammable Hardware Accelerators," IEEE (2000) pp. 1-12.

S. Mahike, et al., "Bitwidth Cognizant Architecture Synthesis of Custom Hardware Accelerators," IEEE Transactions on Computer-Aided Design of Integrated Circuits and Systems, vol. 20, No. 11, (Nov. 2001) pp. 1355-1371.

P. R. Panda, et al., "Data and Memory Optimization Techniques for Embedded Systems," ACM Transactions on Design Automation of Electronic Systems, vol. 6, No. 2, (Apr. 2001) pp. 149-206.

S. Meftali, et al., "An Optimal Memory Allocation for Application-Specific Multiprocessor System-on-Chip," (2001) pp. 19-24.

T. Van Achteren, et al., "Data Reuse Exploration Techniques for Loop-dominated Applications," Proceedings of the 2002 Design, Automation and Test in Europe Conference and Exhibition, IEEE Computer Society, (Jan. 2002).

"Omega Project Source Release, version 1.2," (Aug. 2002), [on-line] [Retrieved on Jul. 16, 2002] Retrieved from: http://www.cs.umd.edu/projects/omega/release-1.2.html, pp. 1-2.

Seeds for Tomorrow's World—IMECnology, [on-line] [Retrieved on Jun. 12, 2002] Retrieved from http://www.imec.be/.

S. Meftali, et al., "An Optimal Memory Allocation for Application-Specific Multiprocessor System-on-Chip," Proceedings of the International Symposium on Systems Synthesis—vol. 14, [on-line] [Retrieved on Jun. 12, 2002] Retrieved from: .../citation.cfm?id=500006&coll=portal&dl=ACM&CFID=2929668&CFTOKEN=57821200.

G. Havas, et al. "Extended GCD and Hermite Normal Form Algorithms Via Lattice Basis Reduction," Experimental Mathmatics, v. 7 (1998).

PCT Written Opinion—New Citations—PCT/US2003/032340 filed Oct. 10, 2003.

McFarland, M C et al—"The High-Level Synthesis of Digital Systems"—Proceedings of the IEEE vol. 78 No. 2—Feb. 1, 1990—pp. 301-318.

Park, N et al—"Sehwa: A Software Package for Synthesis of Pipelines From Behavioral Specification"—IEEE Transactions vol. 7 No. 3 Mar. 1998—pp. 356-370.

R. Schreiber, S. Aditya, S. Mahlke, V. Kathail, B. R. Rau, D. Cronquist, and M. Sivaraman. PICO-NPA: High-level synthesis of nonprogrammable hardware accelerators. Journal of VLSI Signal Processing, 31(2), Jun. 2002.

J. Steensma, B. Vanhoof, F. Catthoor, H. De Man, Symbolic Macro Test for DSP Systems applied to a Voice Coder Application, Workshop on VLSI Signal Processing, pp. 215-223, Oct. 1993.

Anant Agarwal, David Kranz, Automatic Partitioning of Parallel Loops and Data Arrays for Distributed Shared Memory Multiprocessors, IEEE Transactions on Parallel and Distributed Systems, (1995).

R. Trancon, M. Bruynooghe, G. Janssens, F. Catthoor, Storage Size Reduction by In-place Mapping of Arrays, VMCAI, pp. 167-181, (2002).

P.R. Panda, F. Catthoor, N.D.Dutt, K. Dranckaert, E. Brockmeyer, C. Kulkarni, A. Vandecappelle, P.G. Kjeldsberg, Data and Memory Optimization Techniques for Embedded Systems, ACM Trans. Design Autom. Electr. Syst. Vo. 6, No. 2, pp. 149-206, Apr. 2001.

\* cited by examiner

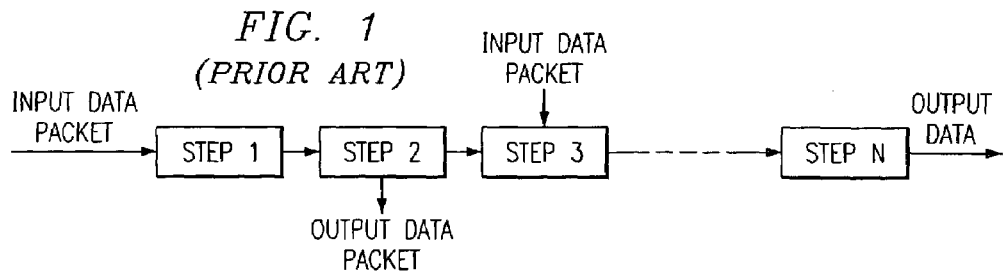
FIG. 1
(PRIOR ART)
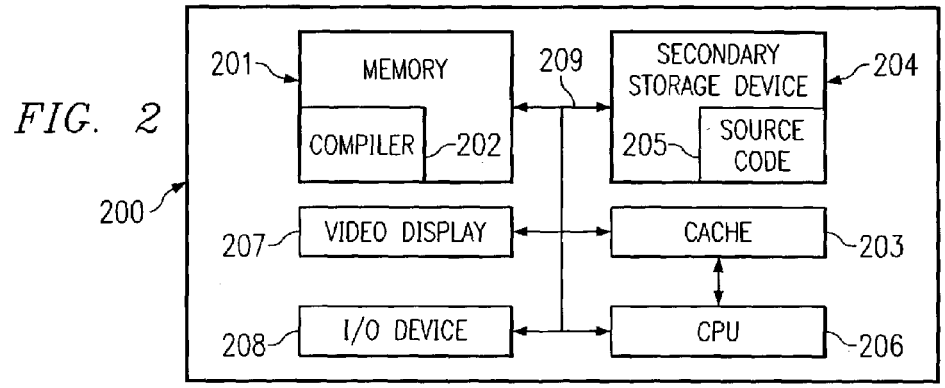
FIG. 2
```
external int input_array[100]
external int output_array[101]
void task_proc()
{
    int i1, i2, i3;
    int internal_array[101];
    for (i1=0; i1<100; i1++)
S1:     internal_array[i1]=1+input_array[i1];
S2:     internal_array[100]=-1;
S3:     internal_array[101]=-2;
    for(i2=0; i2<100; i2++)
    {
S4:     output_array[i2]=0;
        for(i3=0, i3<5; i3++)
        {
            if (i2+i3<=101)
S5:             output_array[i2]=output_array[i2]+internal_array[i2-i3];
        }
    }
}
```
FIG. 3

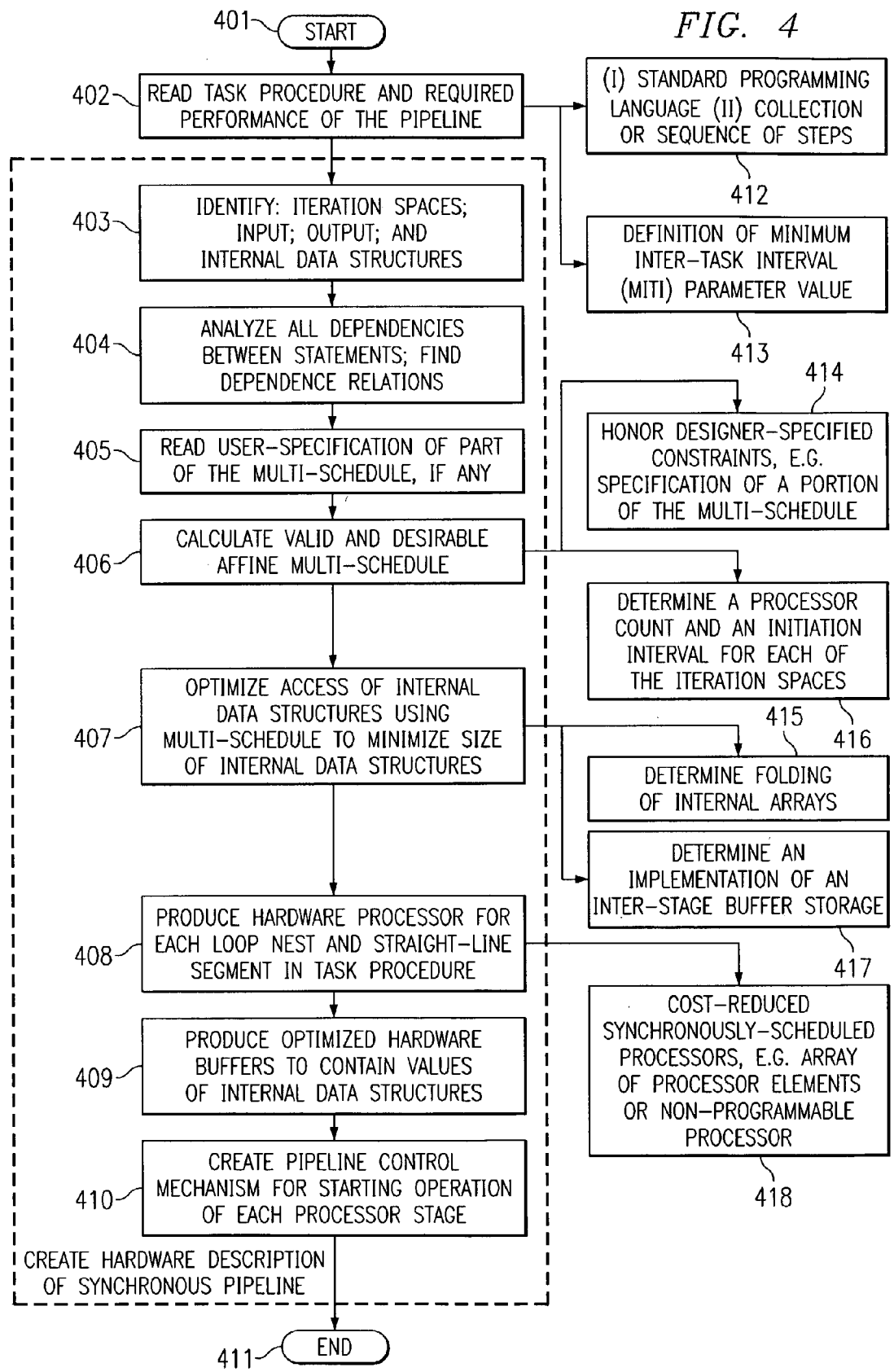

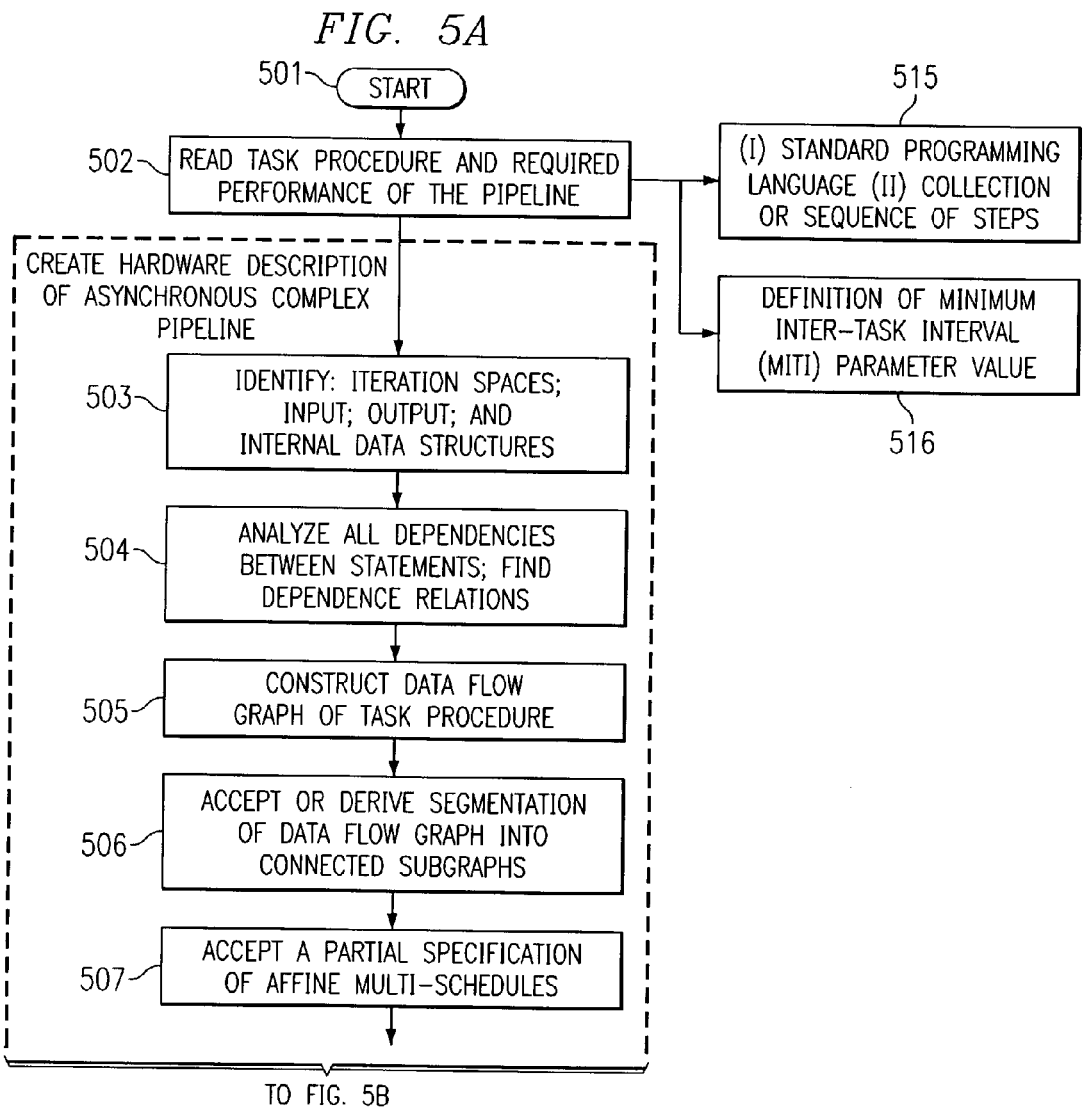

METHOD AND SYSTEM FOR THE DESIGN OF PIPELINES OF PROCESSORS

CROSS-REFERENCE TO RELATED APPLICATIONS

The present application is related to U.S. patent application Ser. No. 10/284,844 entitled SYSTEM AND METHOD OF OPTIMIZING MEMORY USAGE WITH DATA LIFETIMES and to U.S. Pat. No. 6,952,821 entitled METHOD AND SYSTEM FOR MEMORY MANAGEMENT OPTIMIZATION, and to 10/284,965 entitled SYSTEM FOR AND A METHOD OF CONTROLLING PIPELINE PROCESS STAGES, all of which are incorporated herein in their entireties by reference.

FIELD OF THE INVENTION

The present invention is related to computer hardware design and, more particularly, to methods, software and systems for the design of pipelines of processors.

DESCRIPTION OF RELATED ART

A large class of modern embedded-system computations can be expressed as a sequence of transformation on one or more streams of data. The corresponding architecture of such systems is typically organized as a pipeline of processors wherein each stage accepts data from an initial input or from an output of a previous stage, performs a specific task or transformation on the data, and passes the resulting data along to the next stage (if any) or an output of the pipeline. The term processor is used here to encompass a broad class of computing devices, both programmable and nonprogrammable, both statically and dynamically scheduled. The data passed between stages may be "fine-grained" (e.g., word-level) or coarse-grained (e.g., a block or a stripe of data elements). The data exchange between stages may be synchronized using a handshake mechanism between stages (e.g., asynchronous) or timed by a system-wide clock and a fixed delay between stages (e.g., synchronous operations.) The design of such a pipeline of processors involves the design of each stage performing a specific task including its initialization, finalization and control, the design of the buffering mechanism between each pair of stages, and the synchronization mechanism used between every pair of producer (i.e., source or transmitting) and consumer (i.e., destination or receiving) processor stages. Such pipeline architectures are designed manually by looking at a functional specification of the system (i.e., a design document and/or a reference implementation of functionality) and carefully identifying all the components and parameters of the design and optimizing them for minimal cost and maximal performance.

Various publications have addressed the design of such parallel systems. K. K. Danckaert, K. Masselos, F. Catthoor and H. De Man "Strategy for Power-Efficient Design of Parallel Systems", IEEE Transactions on Very Large Scale Integration (VLSI) Systems, Vol. 7, No. 2, Jun. 1999 describes a system-level storage organization for multidimensional signals used as a first step prior to formulation of parallelization or partitioning decisions. F. Vermeulen, F. Catthoor, D. Verkest, H. De Man, "Extended Design Reuse Trade-Offs in Hardware-Software Architecture Mapping," CODES, 2000, proposes a switching protocol providing fine-grain control using a control-flow inspection mechanism and an interrupt mechanism where all necessary data is available in a shared memory. P. Panda, F. Catthoor, N. Dutt, K Danckaert, E. Brockmeyer, C. Kulkarnia, A. Vandercappelle and P. Kjeldsberg "Data and Memory Optimization Techniques for Embedded Systems", ACM Transactions on Design Automation of electronic Systems, Vol 6, No. 2, Apr. 2001, Pages 149–206 includes a survey of various techniques used for data and memory optimization in embedded systems. These and all other publications and patents mentioned herein and throughout this specification are indicative of the technology of the present invention and are incorporated in their entirety by reference.

While ultimately providing a pipeline design and architecture, such manual design methodologies are slow, error prone, and may not achieve optimal design results within the constraint of time and human resources available.

BRIEF SUMMARY OF THE INVENTION

According to one aspect of the invention, a method of designing a pipeline comprises the steps of: accepting a task procedure expressed in a standard programming language, the task procedure including a collection of computational steps, and serving to define the computational function that is to be performed by the pipeline; accepting a performance requirement of the pipeline; and automatically creating a hardware description of the pipeline, the pipeline comprising a plurality of interconnected processor stages, each of the processor stages for performing a respective one of the computational steps, the pipeline having characteristics consistent with the performance requirement of the pipeline.

According to another aspect of the invention, a method of designing a pipeline comprises the steps of: reading a task procedure and a desired throughput of the pipeline, the task procedure including one or more statements; identifying iteration spaces, input, output, and internal (i.e., local to the task procedure) data structures; analyzing dependencies between statements; finding at least one dependence relation between the statements; calculating a valid and desirable multi-schedule, this being a scheduled start time (relative to the start time of said task procedure) for each point in each of said iteration spaces, as well as a scheduled time for each operation relative to the start time of the iteration in which the operation resides; optimizing access of at least one internal data structure using the multi-schedule to minimize a size of a hardware buffer; producing a hardware processor for each loop nest and straight-line segment; and producing optimized hardware buffers to contain values of the internal data structures.

According to another aspect of the invention, a system for designing a pipeline comprises: a memory storing a set of program instructions; and a processor connected to the memory and responsive to the set of program instructions for: (i) accepting a task procedure expressed in a standard programming language, the task procedure including a sequence of computational steps, (ii) accepting a performance requirement of the pipeline, and (iii) automatically creating a hardware description of the pipeline, the pipeline comprising a plurality of interconnected processor stages, each of the processor stages for performing a respective one of the computational steps, the pipeline having characteristics consistent with the performance requirement of the pipeline.

According to another aspect of the invention, a program of computer instructions stored on a computer readable medium includes computer code for performing the steps of: accepting a task procedure expressed in a standard programming language, the task procedure including a sequence of computational steps; accepting a performance requirement of the pipeline; and automatically creating a hardware description of the pipeline, the pipeline comprising a plurality of interconnected processor stages, each of the processor stages for performing a respective one of the computational steps, the pipeline having characteristics consistent with the performance requirement of the pipeline.

BRIEF DESCRIPTION OF THE DRAWINGS

FIG. 1 is a block diagram of a generic prior art pipeline configuration of processors;

FIG. 2 is a block diagram of a computer system consistent with one embodiment of the present invention;

FIG. 3 is a portion of code defining a series of steps to be implemented in hardware in the form of a pipeline of processors according to one embodiment of the present invention;

FIG. 4 is a flow chart of the steps performed when synthesizing a processor pipeline according to one embodiment of the present invention; and FIGS. 5A and 5B illustrate a flow chart of the steps performed when synthesizing an asynchronous complex pipeline composed of synchronous processor sub-pipelines according to another embodiment of the present invention.

DETAILED DESCRIPTION

Figure 5B:
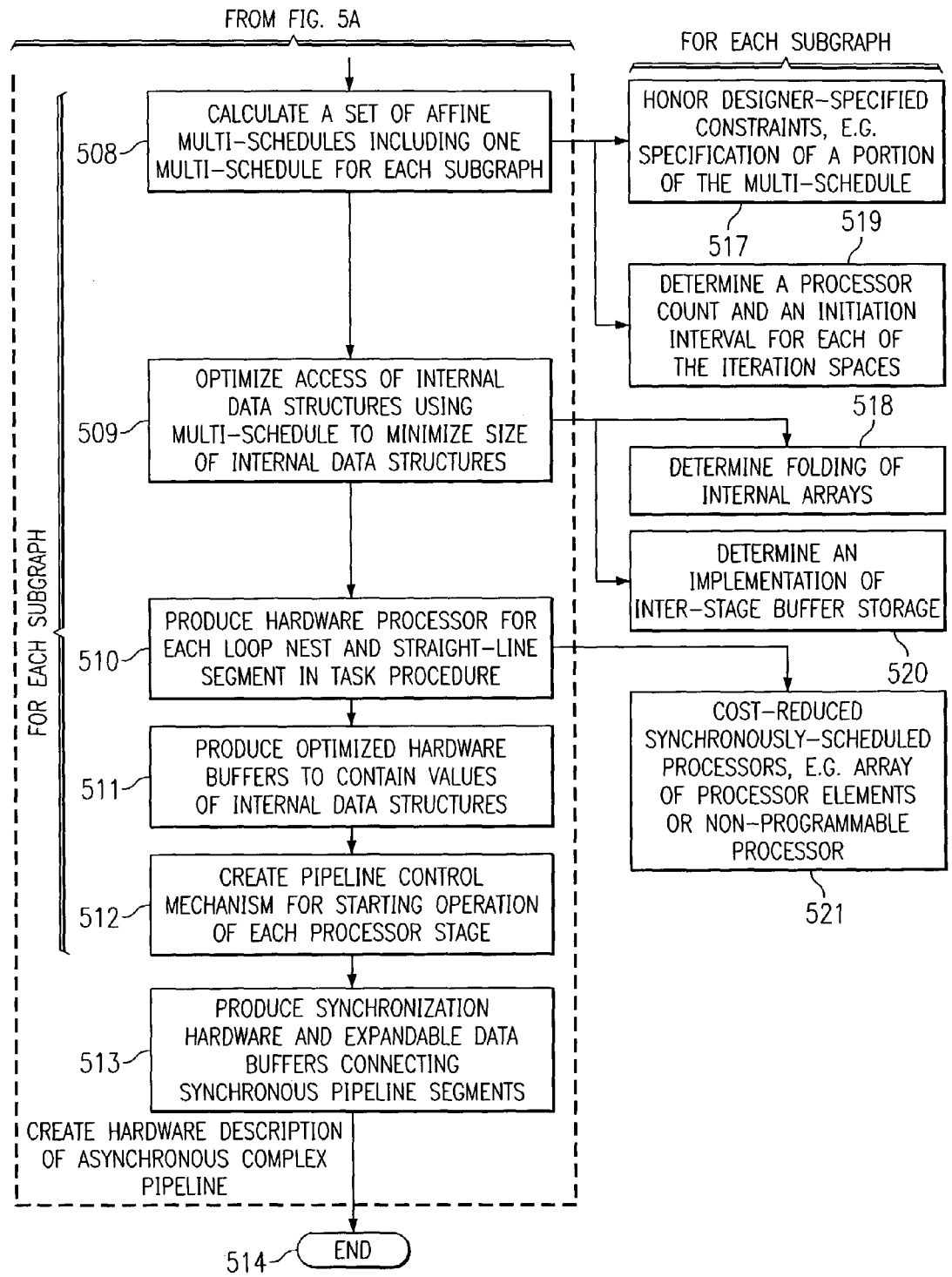

A large class of modern embedded system computations can be expressed as a sequence of transformations on a stream of data. The sequence of transformations may be performed by an acyclic network of process stages hereby known as a "general pipeline" (or simply "pipeline") with at least one start stage that accepts input data from external sources, at least one end stage which outputs data to external destinations, and some number of intermediate stages, each of which accepts data from at least one preceding stage, performs a specific computation or transformation and forwards its results to at least one subsequent stage. A simple example of a "general pipeline" is the common notion of a linear pipeline consisting of a linear sequence of processing stages, where the first stage of the pipeline accepts input data, and each subsequent stage of the pipeline may accept data from the previous stage, may perform a specific computation or transformation on the data, and may pass the result along to the next stage of the pipeline or, in the case of the last stage of a pipeline, output the data. The entire sequence of computations on a given set of input data is called a "task", and the computation within each stage of the pipeline for that input data is called a "step". In addition to the data that is passed between stages of the pipeline, control information may also be necessary to ensure that the various stages of the pipeline perform their function at the appropriate time. Pipeline stages may be separated by buffers, e.g., registers, fifos, or random-access memory, that may be used to store data between the various stages of the pipeline.

The present invention includes embodiments for synthesizing a hardware pipeline or a pipeline hardware processor. Such a hardware pipeline processor implements a sequence of steps applied to a sequence of data packets. Each item in the sequence of data packets is processed by the series of steps in succession, different items in the sequence of data being processed in parallel by each of the stages of the pipeline. Such pipeline configurations are used throughout the electronics industry to provide enhanced computational capabilities and, in particular, where substantial "number crunching" and real-time throughput are required, such as for image processing performed by photo-quality color printers, digital cameras, etc.

Referring to FIG. 1 of the drawings, a pipeline may be configured such that data is input to step 1 (e.g., a first functional unit or system such as a processor) of an n step process, an output being provided from the final step n. Other input streams may enter into other steps of the computation, and other output streams may emerge from other steps of the computation. Data progresses along each of the steps 1-n such that all of n steps are performed at least partially in parallel, but operating on different data. As mentioned, such architectures are used, for example, in digital cameras and printers to implement a color pipeline and otherwise perform image processing. Embodiments of the present invention include mechanisms to design and synthesize the architecture of some pipelines automatically.

Although not shown in FIG. 1, between any two stages of the pipeline there may be a buffer of some kind for storing data values that are in transit from an earlier stage to a later stage. In this application, these hardware structures are called inter-stage buffers. An inter-stage buffer may take the form of a register, set or file of registers, shift register, hardware FIFO, random-access memory (RAM), or any other hardware structure suitable for storing data values. The type and kind of such buffer storage may be chosen by a design system so as to minimize cost. Internal data structures that are referenced in only one loop nest may be stored in optimized intra-stage buffer storage, the type of which and related parameters may also be chosen by a design system to minimize cost.

A mechanism according to an embodiment of the invention may make all the decisions concerning hardware resources to be used, mapping and scheduling the tasks to be performed onto these resources and generating control logic for step initialization, finalization, and the start/stop of the various stages automatically. Embodiments of the invention may include steps and mechanisms to carefully balance several objectives and synthesis of the pipeline including, for example, obtaining high throughput in the pipeline, matching the input/output (I/O) rates of various stages, matching the order in which the elements of a data block are produced with the order in which the elements of the data block are consumed, minimizing a size of inter-stage buffers. Each of these steps, to the extent implemented by the various embodiments of the invention, may include further advantageous methods and structures. For example, minimization of inter- or intra-stage buffer resource requirements may implement a buffer reuse procedure wherein buffer resources are utilized in a time-shared fashion. Further, features of the various embodiments of the invention may include choosing synchronization mechanism and granularity appropriate to the pipeline.

According to one embodiment of the invention, a designer may provide a description of the functions of the pipeline by providing a segment of program code describing the sequence of computational steps, preferably in the form of a sequence of loop nests. Each of the loop nests describes one of the steps to be implemented by a respective stage of the pipeline. In addition, some portions of straight-line code may be included between loop nests. Conceptually, the segments of straight-line code may be handled as if loop nests of depth zero.

A further aspect of the invention allows a user to describe the performance desired by specifying criteria such as, for example, how often a task is to be submitted to and processed by the pipeline. This may require a certain minimum interval between tasks as specified by the user, this interval called the minimum inter-task [initiation] interval (MITI). The MITI specifies the fastest rate at which tasks may be "pushed through" (i.e., processed by) the pipeline. A design may also be required to adhere to constraints on the order of reading the input and order of producing the output.

FIG. 2 depicts a detailed view of computer 200 compatible with an embodiment of the invention, including main memory 201, Cache 203, secondary storage device 204, Central Processing Unit (CPU) 206, video display 207 and input/output device 208 connected by system bus 209. Main memory 201 stores compiler 202. Compiler 202 may operate on source code 205 stored in secondary storage device 204 to produce executable object code. For simplicity it is assumed that related functions including, for example, linking and loading, are performed as necessary to provide an executable object module. Thus, memory allocation, including for Cache 203, may be performed by a combination of software and other systems including, but not limited to, a compiler, linker, loader, specialized utility, etc.

Using a system such as depicted in FIG. 2, appropriate program code may be stored in secondary storage device 204 to implement a method and system according to embodiments of the invention.

Referring to FIG. 3, an example of a procedure is provided to be implemented by a pipeline of processors. The procedure should be well defined with respect to specified internal data and with specified input and output data clearly shown. Another desirable feature of the procedure is that it be well structured, consisting of a sequence of loop nests and intervening well-structured code. That is, among other things, it is preferable that the procedure be expressed without "go to" statements. In addition to the specification of the procedure itself, the desired performance of the pipeline may be provided, one way of doing so is by specification of the MITI. As previously described, the MITI describes the minimum time between the arrivals of input data packets. For example, if the MITI is 100 machine cycles, then the hardware pipeline must be able to accept a new data packet every 100 cycles, and therefore, maintain a rate of task handling up to one task every 100 cycles.

Preferably, embodiments of the invention incorporate the use of static scheduling. In statically scheduled hardware, the time in which every operation in the task procedure is fixed (relative to the task's start time) in advance (e.g., synchronous operation), rather than being dynamically determined as the result of some event or events occurring during a computation (e.g., asynchronous).

Static scheduling may be illustrated in connection with the procedure of FIG. 3. Therein, five assignment statements S1–S5 are found within "task_proc". To each of these assignment statements are associated a space of loop iterations and associated values of the enclosing loop index variables. For example, the iteration space for S1 is:

$$\{i1 | 0 <= i1 < 100\}$$

and, for S5, the space being:

$$\{(i2,i3) | 0 <= i2 < 100 \ \& \ 0 <= i3 < 5\}.$$

For a sequence of statements such as S2 and S3 that occur in a straight-line code segment, i.e., between nests, there is a single iteration space consisting of one "point", corresponding to the one execution of each of the statements in the execution of the task procedure.

To provide a static schedule, a start time may be associated with each iteration of every iteration space. These start times comprise an iteration schedule. In addition, the operations found in each iteration space may have a start time relative to the start of the iteration in which they reside. These relative start times, one for each operation in the task procedure, comprise an operation schedule. The combination of an iteration schedule and an operation schedule precisely determines the start time of every operation that is or may be performed during the execution on one task, relative to the start time of the task.

To provide a useable iteration schedule, affine functions of iteration index vectors may be employed. An integer vector k is associated with each iteration space. The start time of the operations at an iteration whose index vector is i=(i_1, i_2, ... i_d) is given by $$\text{iteration\_start\_time } (i) = k\_0 + i\_1 \ k\_1 + \ldots + i\_d \ k\_d.$$

That is, as expressed in the formula above, iteration i starts at time $k\_0$ plus the dot product of i and ($k\_1, k\_2, \ldots, k\_d$). We denote this by <k,i>. A different vector k is chosen for each iteration space.

Thus, an operation (such at the add operation in statement S5 of the task procedure shown in FIG. 3) that occurs in some iteration space whose index vector is denoted by i, may have a start time, denoted by t(op), given by an operation schedule, relative to the start time of iteration i. When an affine iteration schedule such as is described in the previous paragraph is used, the instance of the operation that occurs in iteration i is scheduled to start at time <k,i>+t(op). Such a schedule, consisting of the affine iteration schedule and the one-per-operation relative start times, is called a shifted-affine schedule.

Considering each of the index spaces, an affine schedule is provided organizing the computation of a loop nest. A suitable mechanism for providing for creation of a hardware processor from a single loop nest is provided by the HP labs PICO-NPA system. This system uses an affine schedule to achieve a specified compute time for a loop nest implemented by a hardware processor. Using such a system, it is possible to call the task procedure that specifies a function as a multi-loop. The collection of affine schedules (expressed as the vectors k), one for each iteration space, provides an affine iteration multi-schedule, referred to herein simply as a multi-schedule in this application. The combination of an operation schedule and an affine multi-schedule comprise a shifted multi-schedule. Thus, embodiments of the invention may include a process for determining a shifted multi-schedule that satisfies both certain required and certain desirable criteria. Such required criteria may include a temporal ordering and a required throughput, while desired criteria may include a reduced total cost of the hardware used to realize the pipeline. In particular, it must be possible to carry out the required computations in the temporal order specified by the shifted multi-schedule without violating the semantics of the original program. This means, among other things, that an operation O2 that requires a particular value computed by an operation O1 should not execute before the execution of O1, such that all required values are available when needed by an operation O2. A shifted multi-schedule is considered to be "valid" if it meets this requirement. It is mathematically possible to determine whether a given affine iteration schedule has the property such that it is possible to find an operation schedule that, together with the given affine iteration schedule, comprises a valid shifted multi-schedule. Thus, an affine iteration schedule is considered valid if it is possible to find an operation schedule that, together with the affine iteration schedule, comprises a valid shifted multi-schedule.

Another requirement is that the throughput implied by the multi-schedule must at least as great as that required by the user. For example, if the user has specified a MITI, then the total length of the schedule for the iteration space (the difference between the max of <k,i> (the latest start time of any iteration in the space) and the min of <k,i> (the earliest start time of any iteration) must be less than the specified MITI.

Among desirable criteria, embodiments of the invention may consider and minimize the total cost of the hardware. In general, the total hardware cost is dominated by the hardware required to realize the specified operations and storage required for internal data structures.

Embodiments of the invention include steps that lead to the design of hardware pipelines in which each loop nest of a task procedure is implemented by a pipeline stage in which an array of processing elements is deployed, and each such processing element is itself pipelined, and has the capacity to process iterations of the loop nest periodically, at a rate determined by an initiation interval (II). Such a pipelined processor starts execution and finishes execution of one iteration of the loop nest every II machine cycles. Embodiments of the invention include steps for determining, for each loop nest in the task procedure, both the number of processing elements to be deployed in the pipeline stage that implements the loop nest and the initiation interval of the processing elements, thereby determining the throughput of the pipeline stage, in a manner consistent with the criterion of achieving the required MITI.

Broadly, embodiments of the invention include steps, processing and/or structure to identify data dependencies within each iteration space and across iteration spaces. The MITI is used to decide the number of processors and the capacity or performance of each processor needed to obtain the desired throughput for each loop nest. The dependencies and the throughput information are used to schedule the iterations of each loop nest (e.g. to determine a mapping from iteration space index vector to the start time of the iteration, such as the affine mapping with parameters k_1 . . . , k_n) and map the iterations to space (e.g. determine a mapping from iteration index vector to processor element in an array of multiple processor elements) and to identify the start of each loop nest relative to the start of the previous loop nest (e.g., k_0 in the affine mapping above). The data produced by one loop nest and consumed by another is passed via an inter-stage buffer whose type, size, and data mapping (the location of a given data item in the buffer is determined by a data mapping) is generated by the pipeline design process. The schedule of a pair of loop nests is selected such that the size of such inter-stage buffers is minimized. Each loop nest is then transformed according to the iteration schedules identified into a time and space loop so as to transform the addressing of each data structure to the appropriate kind of inter-stage buffer. This code is then converted into an assembly-level representation to enable further optimizations geared towards hardware synthesis. In particular, first, each loop may be synthesized into an array of processors according to its iteration schedule and throughput requirement, and then multiple arrays of processors are "strung" together in a pipeline communicating via inter-stage buffers. A back-end hardware synthesis step may arrive at a detailed hardware synthesis of processor arrays and a determination of the schedule of each operation of each loop body relative to the start time for the corresponding iteration of the loop. Preferably, the mechanism to transform a single loop nest into an array of processors is extended to ensure that after the detailed synthesis and scheduling of operations, the addressing and the size of the inter-stage buffers is maintained constant. Alternatively, after such a detailed operation schedule has been obtained, the type and the size of inter-stage buffer hardware and the addressing mechanisms used to access data in such buffers may be adjusted to compensate for perturbations of the schedule. Hardware to initialize and finalize each stage of the pipeline may also be generated based on an analysis of the "livein" and "liveout" values from each loop nest (i.e., the first and last uses of the data). Finally, a pipelined timing controller that is generated automatically using the time schedule of the previously identified loop nests may control each stage of the pipeline. The entire pipeline architecture is then provided in a standard description language at the register-transfer level.

In one embodiment of the invention, the operations of iteration i are scheduled at time equal to the sum of <k,i> and a relative schedule time for the operation. In a preferred embodiment of the invention, the affine multi-schedule (the vectors k, one per iteration space) is determined first according to the methods of the invention. The operation schedule is determined afterwards. The parameters of data buffers may be finalized after the operation schedule is chosen. In another embodiment, parameters of data buffers are chosen before an operation schedule, and an operation schedule may be chosen afterwards with constraints derived from the use of data buffers whose parameters have been determined.

Referring to FIG. 4, an embodiment of a method according to the invention may begin at step 401. At step 402, a task procedure is read together with desired throughput to be provided by a pipeline. As previously described, the task procedure may be provided as a set of instructions such as depicted and described in connection with FIG. 3. The task procedure may be expressed in a standard programming language, for example the C programming language, as indicated in step 412. Throughput may be provided in the form of MITI, as indicated in step 413. In response to these inputs, the sequence of steps 403 through 410, with the ancillary steps 414 through 418, are executed. Together they comprise a macro-step of creating a hardware description of a synchronous hardware pipeline as interconnected, synchronously scheduled processor stages.

At step 403, iteration spaces, input, output, and internal data structures to be used by the pipeline are identified. At step 404 an analysis is performed of all the dependencies between the statements and all the dependence relationships are found. At step 405, user constraints on the schedule, in the form of a specification by the user of some components of the affine multi-schedule, can be accepted. These allow the user to specify, among other things, a required order for reading the input or writing the output from the pipeline. At step 406 a calculation may be performed to provide a valid and desirable multi-schedule. Such calculation may include a step (step 416 in the figure) of determining the number of processing elements and their initiation interval for each loop nest. User specified constraints, such as a partial specification of the multi-schedule, are honored in this step as indicated (step 414). Further details of step 406 are discussed below. Optimization of the ways in which internal data structures are accessed is performed at step 407, making use of knowledge of the multi-schedule to reduce the size of the hardware buffers used to store internal data structures. Such optimization may include a step (e.g., step 417) of choosing a type of buffer storage for implementing an internal data structure or data structures. In the case of internal arrays, such optimization may include determining a folded mapping of the array to memory locations so as to minimize the amount of memory required for storage of the array, as indicated in step 415. Techniques for reducing or minimizing the size of the internal data structures may include time-sharing of memory through folded mappings of data arrays to memory, as described in co-pending U.S. application Ser. No. 10/284,844 entitled OPTIMIZING MEMORY USAGE WITH DATA LIFETIMES and/or by the optimized management of memory as described, for example, in co-pending U.S. Pat. No. 6,952,821 entitled METHOD OF AND SYSTEM FOR MEMORY OPTIMIZATION, both of which are incorporated herein in their entireties by reference.

At step 408 a hardware processor is produced for each loop nest and straight-line segment in the task procedure; the hardware processor may take the form of a cost-reduced synchronously scheduled processor or array of processing elements, as indicated in step 418. At step 409, an optimized hardware buffer configuration is produced that contains the values of the internal data structures. Finally, at step 410, a pipeline controller is produced as well; it signals each pipeline segment to start at the appropriate clock cycles for a particular task. As a result of this processing, a pipelined architecture is provided that may be used to generate a register-transfer level (RTL) description of one pipeline.

Referring to FIG. 5, an embodiment of another method according to the invention may begin at step 501. At step 502, a task procedure is read together with a desired throughput to be provided by a pipeline. As previously described, the task procedure may be provided as a set of instructions such as depicted and described in connection with FIG. 3. The task procedure may be expressed in a standard programming language, for example the C programming language, as indicated in step 515. Throughput may be provided in the form of MITI, as indicated in step 516. As a result of these inputs, at step 503, iteration spaces, input, output, and internal data structures to be used by the pipeline are identified. At step 504 an analysis is performed of all the dependencies between the statements and all the dependence relationships are found. At step 505, a data-flow graph representation of the task procedure is constructed. At step 506, the data-flow graph is segmented into connected subgraphs; this segmentation may be derived automatically using heuristic algorithms or it may be provided by a user and accepted by the automatic design procedure.

At step 507, user constraints on the schedule, in the form of a specification by the user of some components of the affine multi-schedule, can be accepted. These allow the user to specify, among other things, a required order for reading the input or writing the output from the pipeline.

Steps 508 through 512, together with their ancillary steps 517 through 521 are then repeated, once for each of the subgraphs determined in step 506. These steps constitute the macro-step of generating a hardware description of a synchronous hardware sub-pipeline and control unit for each subgraph of the segmented data-flow graph. A description of these steps follows.

At step 508 a calculation may be performed to provide a valid and desirable multi-schedule. Such calculation may include a step 519 of determining the number of processing elements and their initiation interval for each loop nest. User specified constraints, such as a partial specification of the multi-schedule, are honored at step 517. Further details of step 508 are discussed below. Optimization of the ways in which internal data structures are accessed is performed at step 509, making use of knowledge of the multi-schedule to reduce the size of the hardware buffers used to store internal data structures. Such optimization may include a step (e.g., step 520) of choosing a type of buffer storage for implementing an internal data structure or data structures. In the case of internal arrays, such optimization may include determining a folded mapping of the array to memory locations so as to minimize the amount of memory required for storage of the array, as indicated in step 518. Techniques for reducing or minimizing the size of the internal data structures may include time-sharing of memory through folded mappings of data arrays to memory, as described in co-pending U.S. application Ser. No. 10/284,844.

At step 510 a hardware processor is produced for each loop nest and straight-line segment in the task procedure; said hardware processor may take the form of a cost-reduced synchronously scheduled processor or array of processing elements, as indicated in step 521. At step 511, an optimized hardware buffer configuration is produced that contains the values of the internal data structures. At step 512, a pipeline controller is produced as well; it signals each pipeline segment to start at the appropriate clock cycles for a particular task. As a result of this processing, a pipelined architecture is provided that may be used to generate a register-transfer level (RTL) description of one synchronous sub-pipeline in an asynchronous complex pipeline.

Finally, at step 513, hardware descriptions are produced for synchronization hardware and expandable data buffers connecting the synchronous sub-pipelines previously created (one per subgraph). As a result of this processing, an RTL hardware description of an asynchronous complex pipeline for implementing the task procedure is created.

A feature of the various embodiments of the invention may include use of an optimized, statically chosen, affine multi-schedule. Use of an affine multi-schedule supports the building of efficient hardware that does not waste time and resources doing run time synchronization. The multi-schedule is optimized in the sense that, among all possible, legal affine multi-schedules, the selected schedule achieves required performance criteria while minimizing hardware implementation costs. This multi-schedule may be identified automatically.

The multi-schedule may consist of an affine schedule k for each iteration space. The affine schedule has a constant term $k\_0$ and a linear term $(k\_1, \ldots, k\_d)$. All of these terms represent integers. The total schedule length for an iteration space may be computed given its affine schedule such that the total schedule length equals:

$$(max \text{ iteration\_start\_time } (i) - min \text{ iteration\_start\_time } (i))$$

where i ranges over the iteration space and iteration_start_time (i) may be given in terms of clock cycles or other units used by the user to specify the MITI. Thus, the multi-schedule is fast enough if the total schedule length for each iteration space is less than MITI.

Finding a multi-schedule also may take into consideration dependencies between iterations of the single loop nest, and dependencies between iterations of different loop nests. These dependencies determine whether or not a multi-schedule is valid. For dependencies between iterations of a single loop nest, it is required that the linear portions of the schedule vectors k satisfy certain linear inequalities, determined by analysis of the dependence relation. The schedule vectors for other iteration spaces may not be a concern, and constant terms need not be considered. For dependencies between statements in different loop nests, one of which is necessarily a predecessor of the other in the sequential control flow, the situation is somewhat different. In this case, whatever the linear terms in the multi-schedule happen to be, it will be possible to select a sufficiently large constant term k_0 in the schedule of the successor nest to delay starting the nest under consideration until the necessary data is available. Thus, one way to find a valid multi-schedule according to an embodiment in the invention includes the steps of:

finding a valid linear schedule for the iteration spaces of each loop nest separately; and selecting constant terms for the loop nests in sequence, making each constant term as small as possible but without sacrificing validity.

Step 406 further may include estimating a hardware cost for a selected multi-schedule. This may be performed by modeling the hardware cost, measuring the cost of the implementation of each step as a statically scheduled, dedicated, special purpose processor array, as well as calculating costs of inter-stage and intra-stage buffers that hold values of the internal data structures as needed. Estimators are used to determine these costs, the estimators driven by the user program and by a proposed multi-schedule. The resultant estimations support selection from among proposed, valid multi-schedules, using the estimated hardware cost as a selection criterion so as to minimize such hardware costs.

One platform for performing the processing specified by step 408 includes the "program in, chip out" (PICO) technology developed by Hewlett-Packard Laboratories (HPL) and described in U.S. Pat. No. 6,298,071 issued Oct. 2, 2001 and U.S. patent application Ser. Nos. 09/378,289 and 09/378,431, all of which are herein incorporated in their entireties by reference.

In another embodiment of the invention, a task procedure may be automatically represented as a dataflow graph in which each graph vertex represents one of the iteration spaces of the task procedure, and graph edges represent a flow of data between the iteration spaces. The dataflow graph may be segmented into connected subgraphs such that each subgraph is suitable for implementation as a synchronous statically scheduled pipeline, using the methods of the present invention. Then hardware may be synthesized for an ensemble of hardware pipelines, one for each subgraph of the dataflow graph, and each in a separate synchronous hardware clock domain. Asynchronous protocols and expandable storage elements such as FIFO or RAM storage may be used to buffer data and synchronize transactions that span multiple clock domains. One possible implementation for a subgraph is compilation onto a programmable processor whose throughput is known but whose schedule is dynamically determined.

What is claimed is:

1. A method of designing a pipeline comprising the steps of:

accepting a task procedure expressed in a standard programming language, said task procedure including a sequence of computational steps;

accepting a performance requirement of the pipeline, the performance requirement comprising a minimum inter-task interval; and automatically creating a hardware description of the pipeline, the pipeline comprising a plurality of interconnected processor stages, each of said processor stages for performing a respective one of said computational steps, said pipeline having characteristics consistent with said performance requirement of the pipeline and said creating comprising:

determining parameters for the pipeline including a set of iteration spaces consistent with said task procedure;

determining a valid and desirable affine multi-schedule of iterations in accordance with a user-specified constraint; and producing a hardware pipeline description and associated pipeline control mechanism description providing functionality consistent with said affine multi-schedule.

2. The method of claim 1 wherein the step of determining a valid and desirable multi-schedule further includes a step of determining a processor count and an initiation interval for each of a plurality of the iteration spaces.

3. The method according to claim 1 wherein said pipeline control mechanism is for starting an operation of each of said processor stages.

4. The method according to claim 1 wherein said step of automatically creating a hardware description of the pipeline further comprises the steps of:

segmenting a data-flow graph of a task procedure;

determining a valid and desirable multi-schedule for each segment of said segmented data-flow graph;

automatically producing a hardware description of a synchronous hardware sub-pipeline and control unit for each segment of said segmented data-flow graph; and automatically producing a hardware description of asynchronous and expandable data and control interfaces between said synchronous hardware sub-pipelines.

5. The method according to claim 1 further comprising the steps of: identifying internal array data structures; and determining a type of buffer storage for implementing each of said array data structures.

6. The method according to claim 5 further comprising the steps of: determining a folding of said arrays; and determining an implementation of RAM buffer storage, said RAM buffer storage being reduced in size consistent with the folding of said internal arrays.

7. The method according to claim 1 in which said computational stages comprise pipelines stages implemented as cost-reduced synchronously scheduled processors.

8. The method according to claim 7 in which one or more of said cost-reduced synchronously scheduled processors comprises of an array of processing elements.

9. The method according to claim 7 in which one or more of said cost-reduced synchronously scheduled processors is not programmable.

10. A method of designing a pipeline comprising the steps of:

reading a task procedure and a desired throughput of the pipeline, said task procedure including one or more statements;

identifying iteration spaces, input, output, and internal data structures;

analyzing dependencies between statements;

finding at least one dependence relation between said statements;

calculating a valid and desirable affine multi-schedule of iterations in accordance with a user-specified constraint;

optimizing access of at least one internal data structure using said multi-schedule to minimize a size of a hardware buffer;

producing a hardware processor for each loop nest and straight-line segment; and producing optimized hardware buffers to contain values of said internal data structures.

11. A system for designing a pipeline, said system comprising:

a memory storing a set of program instructions; and a processor connected to said memory and responsive to said set of program instructions for:
(i) accepting a task procedure expressed in a standard programming language, said task procedure including a sequence of computational steps,
(ii) accepting a performance requirement of the pipeline the performance requirement comprising a minimum intertask interval, and
(iii) automatically creating a hardware description of the pipeline, the pipeline comprising a plurality of interconnected processor stages, each of said processor stages for performing a respective one of said computational steps, said pipeline having characteristics consistent with said performance requirement of the pipeline and said creating comprising:
determining parameters for the pipeline including a set of iteration spaces consistent with said task procedure;
determining a valid and desirable affine multi-schedule of iterations in accordance with a user-specified constraint; and
producing a hardware pipeline description and associated pipeline control mechanism description providing functionality consistent with said affine multi-schedule.

12. The system according to claim 11 wherein said processor is responsive to said minimum intertask interval for creating said hardware description.

13. The system according to claim 11 wherein said processor is further responsive to said set of program instructions for:
determining a folding of internal array data structures; and
determining an implementation of RAM buffer storage;
said RAM buffer storage being reduced in size consistent with the folding of said internal arrays.

14. The system according to claim 11 in which said computational stages comprise pipelines stages implemented as cost-reduced synchronously scheduled processors.

15. A program of computer instructions stored on a computer readable medium, said program comprising computer code for performing the steps of:
accepting a task procedure expressed in a standard programming language, said task procedure including a sequence of computational steps;
accepting a performance requirement of the pipeline, the performance requirement comprising a minimum intertask interval; and
automatically creating a hardware description of the pipeline, the pipeline comprising a plurality of interconnected processor stages, each of said processor stages for performing a respective one of said computational steps, said pipeline having characteristics consistent with said performance requirement of the pipeline and said creating comprising:
determining parameters for the pipeline including a set of iteration spaces consistent with said task procedure;
determining a valid and desirable affine multi-schedule of iterations in accordance with a user-specified constraint; and
producing a hardware pipeline description and associated pipeline control mechanism description providing functionality consistent with said affine multi-schedule.

16. The program of computer instructions according to claim 15 further comprising computer code for performing the steps of:
determining a folding of internal arrays; and
determining an implementation of a RAM buffer storage;
said RAM buffer storage being reduced in size consistent with the folding of said internal arrays.

17. The program of computer instructions according to claim 15 in which said computational stages comprise pipelines stages implemented as cost-reduced synchronously scheduled processors.

* * * * *